(12) United States Patent
Berman et al.

(10) Patent No.: US 10,783,970 B2
(45) Date of Patent: Sep. 22, 2020

(54) CONSOLIDATION OF COPY-BACK AND WRITE IN PRAM BLOCKS

(71) Applicant: SAMSUNG ELECTRONICS CO., LTD., Suwon-si, Gyeonggi-Do (KR)

(72) Inventors: Amit Berman, Ramat Gan (IL); Ariel Doubchak, Ramat Gan (IL); Noam Livne, Ramat Gan (IL)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 3 days.

(21) Appl. No.: 16/218,210

(22) Filed: Dec. 12, 2018

(65) Prior Publication Data

US 2020/0194080 A1 Jun. 18, 2020

(51) Int. Cl.
*G11C 16/16* (2006.01)
*G11C 16/12* (2006.01)
*G11C 16/10* (2006.01)

(52) U.S. Cl.
CPC ............ *G11C 16/16* (2013.01); *G11C 16/107* (2013.01); *G11C 16/12* (2013.01)

(58) Field of Classification Search
CPC ........ G11C 16/16; G11C 16/107; G11C 16/12
See application file for complete search history.

(56) References Cited

U.S. PATENT DOCUMENTS

2016/0011971 A1* 1/2016 Lee ................. G06F 12/0246
                                                       711/103
2016/0180936 A1* 6/2016 Choi ..................... G11C 16/10
                                                       365/185.12

* cited by examiner

*Primary Examiner* — Tri M Hoang
(74) *Attorney, Agent, or Firm* — F. Chau & Associates, LLC

(57) ABSTRACT

A method for performing a write operation in a random access memory (RAM) includes selecting a target block in a RAM with a greatest number of invalid pages, reading valid pages from target block, when a number of invalid pages is greater than a predetermined threshold, performing a bitline-wise block erase of the target block in said RAM, and copying-back valid data to the erased target block in a row-by-row set operation, wherein the erased target block is written with the valid data. Performing the bitline-wise block erase includes sequentially powering on each bitline with a predetermined reset voltage where all other bitlines and wordlines are grounded.

19 Claims, 10 Drawing Sheets

Table 1

| Parameter | Value | Units | Details |
|---|---|---|---|
| M | 128 | rows | the number of rows in PRAM block |
| N | 16384 | columns | the number of columns in PRAM block (2KB) |
| Vset | 2 | [volt] | target wordline's voltage during SET |
| Vrst | 2 | [volt] | target bitline's voltage during RST |
| Vrd | 0.5 | [volt] | target wordline's voltage during READ |
| Vswl | 1 | [volt] | unselected wordline's voltage during SET |
| Vsbl | 1 | [volt] | unselected bitline's voltage during SET |
| Vrwl | 1 | [volt] | unselected wordline's voltage during RESET |
| Vrbl | 1 | [volt] | unselected bitline's voltage during RESET |
| RL | 100 | [KΩ] | resistance of PRAM at LRS |
| RH | 1000 | [KΩ] | resistance of PRAM at HRS |

Table 2

FIG. 5

| Analysis | Calculation of Invalid Pages Threshold (i) for Consolidated Copy-Back with Write |
|---|---|
| Shortcuts | $\alpha = \frac{M N}{2}\left\{P_{RST} + \frac{V_{BSL}^2}{R_H} + P_{RST} + \frac{(V_{BST}-V_{BSL})^2}{R_H} + \frac{(N-1)}{T}\left[V_{SWL}^2 + (V_{SWL}-V_{SBL})^2\right]\left(\frac{1}{2 R_L} + \frac{1}{2 R_H}\right)\right\}$ <br><br> $\beta = \frac{1}{T}\left(\frac{1}{4 R_L} + \frac{3}{4 R_H}\right)\left\{\frac{N}{4}\left[(V_{RST}-V_{RWL})^2 + 3(V_{RBL}-V_{RWL})^2\right] + \frac{N}{2}\left[V_{SWL}^2 + (V_{SWL}-V_{SBL})^2\right]\right\}$ <br><br> $\gamma = \frac{1}{2}\left(\frac{1}{12 R_L} + \frac{1}{12 R_H}\right)\left\{\frac{N}{4}\left[(V_{RST}-V_{RWL})^2 + 3(V_{RBL}-V_{RWL})^2\right] + \frac{N}{2}\left[V_{SWL}^2 + (V_{SWL}-V_{SBL})^2\right]\right\}$ <br><br> $\delta = P_{RD} + \frac{N}{2} P_{RST} + \frac{2N}{4} V_{RBL}^2 \left(\frac{1}{4 R_L} + \frac{3}{4 R_H}\right) + \frac{N}{4}\left(P_{RST} + \frac{V_{RST}^2}{R_L}\right) + \frac{N}{2}(V_{RST}-V_{RBL})^2 \frac{1}{R_H}$ |
| Crossing Point | $P_{CBWR}(i) = P_{RD-SUB-RBL}(i)$ <br><br> $\frac{(M-1)}{T} P_{RD} + \frac{N}{T} = \delta + (i-1)\beta + (2M-i-1)\gamma$ <br><br> $M \cdot P_{RD} - i P_{RD} + \alpha = i\delta + i^2\beta - i\beta + 2M \cdot \gamma \cdot i - i^2 \gamma - i\gamma$ <br><br> $(\gamma-\beta)i^2 + (\beta+\gamma-2M\cdot\gamma-\delta-P_{RD})i + M\cdot P_{RD} + \alpha = 0$ <br><br> $i_{1,2} = \frac{(2M\gamma+\delta+P_{RD}-\beta-\gamma)\pm\sqrt{(\beta+\gamma-2M\gamma-\delta-P_{RD})^2 - 4(\gamma-\beta)(M\cdot P_{RD}+\alpha)}}{2(\gamma-\beta)}$ <br><br> $i = \frac{(2M\gamma+\delta+P_{RD}-\beta-\gamma)-\sqrt{(\beta+\gamma-2M\gamma-\delta-P_{RD})^2 - 4(\gamma-\beta)(M\cdot P_{RD}+\alpha)}}{2(\gamma-\beta)}$ |

Table 3

| PA | VA | S |
|----|----|----|
|    |    | $s_0 = -1$ |
| 0  | 0  |    |
| 1  | 1  |    |
| 2  | X  | $s_1 = 1$ |
| 3  | 2  |    |
| 4  | 3  |    |
| 5  | X  | $s_2 = 3$ |
| 6  | X  | $s_3 = 3$ |
| 7  | 4  |    |

CONSOLIDATION OF COPY-BACK AND WRITE IN PRAM BLOCKS

TECHNICAL FIELD

Embodiments of the present disclosure are directed to methods for improving the efficiency of write operations in phase change random access memory (PRAM).

DISCUSSION OF THE RELATED ART

Phase-Change RAM (PRAM) is currently a leading next-memory approach. However, although single cell write and read power are low cost and competitive, packing multiple cells in dense cross-point array architectures cause memory operations to consume high power due to effects on unselected cells. The resulting energy magnitude offsets cell advantages. Therefore, array-scale process design and data management algorithms are needed to cope with redundant power issues.

To switch a cell from high to low-resistance state, a high voltage drop is required. The corresponding wordline and bitline are assigned with the required potentials, but the unselected cells that are placed on the same row or column also suffer from voltage variations. Attempts to reduce the resulting unwanted potentials by using additional voltage on unselected bitlines pass the problem to unselected cells on those columns and to assignment of voltage in other wordlines. Eventually, a set of four voltages, for the selected and unselected rows and columns, is used to mitigate unwanted power and write disturb. The equivalent process is performed when transforming cells from low to high-resistance state, with reverse voltage drops, possibly in other values.

Write operations are the main source of power consumption in emerging phase change memory (PCM) technologies, such as phase change RAM (PRAM). In a cross-point vertical array architecture, a set of voltages or high impedances is applied to all wordlines and bitlines such that the intended write voltage is the potential difference over target cells, causing their resistance to be switched. However, unselected cells also have unintended voltage drops. Since the resistance gap between low and high cell states is at least about an order of magnitude, almost all unwanted power, and consequentially most of total write power, is consumed by low-resistance cells, located in unselected wordlines.

SUMMARY

Exemplary embodiments of the present disclosure are directed to systems and methods for improving PRAM write algorithms by combining a write algorithm with selective valid pages read and copy-back. Analysis shows that up to a 40% power reduction can be obtained as compared to prior art algorithms. Embodiments of the disclosure can be implemented by modifying the software of an SSD controller. A method according to an embodiment of the disclosure is scalable as PRAM blocks occupy more wordlines.

According to an embodiment of the disclosure, there is provided a method for performing a write operation in a random access memory (RAM), including selecting a target block in a RAM with a greatest number of invalid pages, reading valid pages from target block, when a number of invalid pages is greater than a predetermined threshold, performing a bitline-wise block erase of the target block in said RAM, and copying-back valid data to the erased target block in a row-by-row set operation, wherein the erased target block is written with the valid data.

According to a further embodiment of the disclosure, the method includes receiving an incoming write request, and writing data of the incoming write request to the target block in the row-by-row set operation, wherein the incoming data is written to the erased block along with the valid data.

According to a further embodiment of the disclosure, the method includes placing data of the incoming write request in a write buffer of a controller of said RAM.

According to a further embodiment of the disclosure, performing the bitline-wise block erase comprises sequentially powering on each bitline with a predetermined reset voltage wherein all other bitlines and wordlines are grounded.

According to a further embodiment of the disclosure, the method includes, when the number of invalid pages is less than or equal to the predetermined threshold, performing a sub-block write operation of data received with a write request.

According to a further embodiment of the disclosure, the RAM is one selected from a group comprising a phase change random-access memory, a resistive random-access memory, a ferroelectric random-access memory, and a magnetoresistive random-access memory.

According to a further embodiment of the disclosure, the bitline-wise block erase is one of a partial block erase or a full block erase.

According to a further embodiment of the disclosure, the steps of selecting a target block, reading valid pages from target block, performing a bitline-wise block erase of the target block, and copying-back valid data to the erased target block are performed as one of an automatic refresh operation or as an operation initiated by a user.

According to a further embodiment of the disclosure, the method includes mapping a logical address of a bitline of the target block to a virtual address according to $f(\vec{x}) = \vec{x} \cdot P \cdot \vec{b} + r + c \cdot q \pmod{2^n + z}$, wherein $\vec{x}$ is an n-bit logical address, $f(\vec{x})$ is the virtual address, n is a log (base 2) of the logical address space size, P is an invertible n×n permutation matrix, $\vec{b} = (2^{n-1}, 2^{n-2}, \ldots, 1)^T$ is a vector that converts the binary n-bit address to a natural number, z is a current number of spare lines, $$c = \begin{cases} 1, & \text{if } \vec{x} \cdot P \cdot \vec{b} \geq n - s \\ 0, & \text{otherwise} \end{cases},$$

r is a round number, wherein a round is an act of remapping all lines in the target block, and s is a step number, wherein a step is an act of re-mapping one bitline.

According to a further embodiment of the disclosure, the method includes mapping the virtual address of the bitline of the target block to a physical address by mapping the virtual address v to v+i where i is the index of a maximum value s such that $s_i < v$, wherein $s_i \in S = (s_1, \ldots, s_l)$ wherein a value of $s_i$ is a largest virtual address that maps to a physical address below $b_i$ wherein $b_i \in (b_1, \ldots, b_l)$, a sorted list of physical addresses of bad lines wherein l is a current number of bad lines.

According to another embodiment of the disclosure, there is provided a non-transitory program storage device readable by a computer, tangibly embodying a program of instructions executed by the computer to perform the method steps for a write operation in a random access memory (RAM).

According to another embodiment of the disclosure, there is provided a method of performing a write operation in a random access memory (RAM), including selecting a target block in a RAM with a greatest number of invalid pages, and performing a sub-block write operation of data received with a write request, when the number of invalid pages is less than or equal to the predetermined threshold.

BRIEF DESCRIPTION OF THE DRAWINGS

FIG. 5 is a graph of power consumption results as a function of the number of invalid pages in a PRAM block for various write algorithms, according to embodiments of the disclosure.

FIG. 6 is a table that presents device and array parameters that are considered in the power estimation, according to embodiments of the disclosure.

FIG. 9 is a table that illustrates an example of a V2P mapping, where virtual addresses that are X's denote bad lines, according to an embodiment of the disclosure.

DETAILED DESCRIPTION OF EXEMPLARY EMBODIMENTS

Figure 1A:
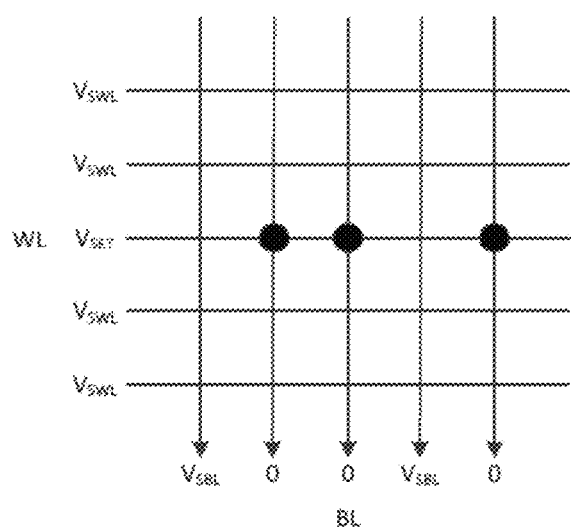
FIGS. 1A-1B illustrate a voltage configuration of a single wordline write operation in a cross-point PRAM, according to an embodiment of the disclosure.

Exemplary embodiments of the disclosure as described herein generally provide systems and methods for improving PRAM write algorithms by combining a write algorithm with selective valid pages read and copy-back. While embodiments are susceptible to various modifications and alternative forms, specific embodiments thereof are shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the disclosure.

Past research has indicated that write power can be reduced by writing pages in block resolution rather than wordline. This scheme, referred as sub-block write aggregation, was to buffer a group of write requests, select the block with the most invalid wordlines, and then perform all phase RESETs, which modify cells to high-resistance, in a row-by-row manner, followed by a SET to group cells separately. In this algorithm, the unintended voltage drops are located mostly on high-resistance cells. Analysis of the results showed there was an up to 85% energy reduction as compared to random wordline writes. The scheme was expanded to include multi-level cell (MLC) writes and to manage opportunistic power-saving writes.

Embodiments of the disclosure are directed to methods of improving PRAM write algorithms to save additional energy, by combining a write algorithm with selective valid pages read and copy-back. It has been observed that performing a bitline-wise RESET to a whole block, by setting all bitlines with the RESET voltage while all wordlines are grounded at zero volts, is highly power-efficient. Therefore, embodiments of the disclosure are directed to a case of copying valid pages, execute bitline-wise block erase, and writing back the valid data along with new incoming write requests. When the number of invalid wordlines is low, the previous sub-block write scheme is expected to be more power-efficient, whereas when most of the wordlines are invalid, it is preferable to read valid pages, perform bitline-wise erases and copy-back the data along with the new data write. A consolidation scheme according to an embodiment calculates the number of invalid pages in which such a process has advantage over sub-block write aggregation. Power dissipation can be modeled in both processes to find the number of invalid pages in which copy-back outperforms sub-block, and this selection can be integrated with online write algorithm.

NOTATIONS AND DEFINITIONS

Notation 1 (Cross-Point Array Size): The number of (rows)× (columns) in a memory cells matrix is denoted with M×N, where the cross-point array wordlines (rows) and bitlines (columns) are denoted with M and N. In addition, WL/BL are the abbreviations for wordline/bitline, respectively.

Notation 2 (Data Distribution and Cell's States): Data according to embodiments is assumed to be distributed binary with Bernoulli-(½) probability. The device is considered as binary (single set level cell—SLC) with low-resistance state (LRS) marked with $R_L$ and high-resistance (HRS) with $R_H$. An MLC generalization is given below.

Notation and Definition 3 (Random Wordline Write): A write process according to an embodiment includes two steps: SET and RESET (or vice versa). In a RESET phase, cells are switched to HRS (RESET) by applying a reset voltage $V_{RST}$ on the wordline and grounding (0 volt) target cell bitlines. The unselected rows/columns are powered with $V_{RWL}/V_{RBL}$. If a prior read is carried and only the LRS cells among the involved cells are selected, power consumption is reduced. In a SET phase, cells are switched to LRS (SET). The voltage $V_{SET}$ is used for target wordline, intended cells bitlines are grounded and $V_{SW1}/V_{SBL}$ are used for unselected worldines/bitlines.

Notation and Definition 4 (Sub-Block Write): An algorithm according to an embodiment buffers several write requests, selects the block with the most invalid pages, performs RESET to all invalid pages according to new data, using a prior read to avoid power waste, followed by a proper row-by-row SET.

Notation and Definition 5 (Bitline-Wise Block Erase and SET): A first erase phase according to an embodiment sets $V_{RST}$ in each bitline, while other bitlines are grounded, and grounds all wordlines. Next, the block is written with wordline SET operations, i.e., $V_{SET}$ on target wordline, selected cells bitlines are grounded and unselected rows/columns are powered with $V_{SW1}/V_{SHL}$.

Notation and Definition 6 (RESET/SET and Read Power): According to embodiments, the power to switch a cells from a low to high, or a high to low, resistance state is denoted $P_{RST}$ or $P_{SET}$, respectively. The consumed power during wordline read is denoted $P_{RD}$.

Notation and Definition 7 (Write Power of a Single Memory Cell): According to embodiments, the power needed to change a single cell's resistance state from low to high (reset) is denoted and defined as:

$$P_{RST} = \int_{R_L}^{R_H} I(R) V_{RST} dR,$$

where I(R) is the current through the PRAM device at resistance R. The alternative cell's high to low write (set) power is:

$$P_{SET} = \int_{R_H}^{R_L} I(R) V_{SET} dR.$$

The latencies of set and reset are assumed to be relatively the same: $t_{SET} = t_{RST}$, and therefore the energy is proportional to power. In case that the set time differs from the reset time, the analysis still holds and derivation of energy data would require multiplying the power with the corresponding time duration.

Notation and Definition 8 (Read Operation and Power): According to embodiments, a read is performed by powering the target wordline with $V_{RD}$ when all bitlines are grounded (0v). The current at each bitline is measured for the cell's resistance estimation. The power of the read process (with random data distribution) is:

$$P_{RD} = \frac{N}{2} V_{RD}^2 \left( \frac{1}{R_L} + \frac{1}{R_H} \right).$$

The read power includes a parasitic component that originates from sneak current. This fraction may be considered to be negligible when compared to the overall power and may be omitted in a gain analysis.

Figure 1B:
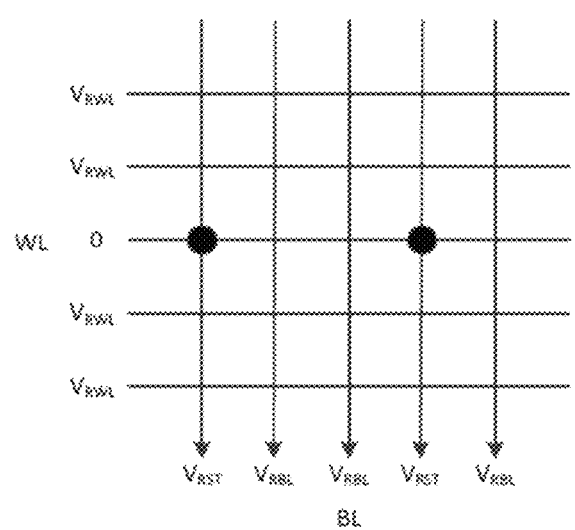

FIGS. 1A-1B illustrate a voltage configuration of a single wordline write operation in a cross-point PRAM, according to an embodiment of the disclosure. In a SET operation, illustrated in FIG. 1A, the middle wordline is written such that second, third and fifth cells (from left to right, marked with black circles) are switched to LRS with voltage drops $V_{SET}$. The unselected wordlines and bitlines are powered with $V_{SWL}$ and $V_{SBL}$. In a RESET operation, illustrated in FIG. 1B, the first and fourth cells are at the middle wordline are switched to HRS by voltage drop of $-V_{RST}$. The remaining unselected wordlines and bitlines are powered with $V_{RWL}$ and $V_{RBL}$. The order can be either SET-before-RESET or RESET-before-SET.

Power Comparison of Write Methods

According to an embodiment, an analytical model of power consumption is constructed for a consolidated copyback and write method.

1) Random Wordline RESET&SET with Prior Read

In a planned read operation according to an embodiment, the location of HRS cells is known. Out of N/2 planned HRS, half are already in that state and reset is executed on N/4 cells. The unselected cells on target wordline are N/2 HRS and N/4 in LRS and are affected with $V_{RBL}$. The remaining wordlines are N/4 cells affected by $V_{RST}-V_{RWL}$ and 3N/4 cells affected by $V_{RBL}-V_{RWL}$, with equally distributed LRS and HRS cells. The power of the reset phase with known wordlines is:

$$P_{RD-RBS-RST} = \frac{N}{4} P_{RST} + \frac{3N}{4} V_{RBL}^2 \left( \frac{1}{3R_L} + \frac{2}{3R_H} \right) +$$
$$(M-1) \left[ \frac{N}{4} (V_{RST} - V_{RWL})^2 \left( \frac{1}{R_L} + \frac{1}{R_H} \right) + \right.$$
$$\left. \frac{3N}{4} (V_{RBL} - V_{RWL})^2 \left( \frac{1}{R_L} + \frac{1}{R_H} \right) \right].$$

Similarly, the LRS cells are known prior to the set phase and N/4 out of planned N/2 are already in LRS. The remaining wordline cells are at HRS due to previous reset phase.

$$P_{RD-RBS-SET} = \frac{N}{4} P_{SET} + \frac{3N}{4} (V_{SET} - V_{SBL})^2 \left( \frac{1}{3R_L} + \frac{2}{3R_H} \right) +$$
$$(M-1) \left[ \frac{N}{4} V_{SWL}^2 \left( \frac{1}{2R_L} + \frac{1}{2R_H} \right) + \frac{3N}{4} (V_{SWL} - V_{SBL})^2 \left( \frac{1}{2R_L} + \frac{1}{2R_H} \right) \right].$$

The overall power in reset-before-set with prior read is:

$$P_{RD-RBS} = P_{RD} + P_{RD-RBS-RST} + P_{RD-RBS-SET} = P_{RD} + \frac{N}{4} P_{RST} + \frac{N}{4} P_{SET} +$$
$$\frac{3N}{4} V_{RBL}^2 \left( \left( \frac{1}{3R_L} \right) + \left( \frac{2}{3R_H} \right) \right) + \frac{3N}{4} (V_{SET} - V_{SBL})^2 \left( \left( \frac{1}{3R_L} \right) + \left( \frac{2}{3R_H} \right) \right) +$$
$$\frac{N(M-1)}{4} \left( \frac{1}{2R_L} + \frac{1}{2R_H} \right) [(V_{RST} - V_{RWL})^2 + 3(V_{RBL} - V_{RWL})^2] +$$
$$\frac{N(M-1)}{4} \left( \frac{1}{2R_L} + \frac{1}{2R_H} \right) [V_{SWL}^2 + 3(V_{SWL} - V_{SBL})^2]$$

Note that RESET-before-SET and SET-before-RESET were found to have about the same power consumption for a random wordline.

2) Sub-Block RESET&SET Aggregation with Prior Read

Since it is not common that a whole block contains invalid pages, a write operation according to an embodiment can be performed in sub-block resolution. The selected block has i invalid wordlines, which are first all RESET sequentially (each row separately) and then SET (wordline-wise). In the RESET phase, the power of unselected cells is gradually decreasing. In the first RESET operation, all other rows (M−1 rows) have expectancy of half of the cells at LRS. Adding a prior read to a sub-block write flow reduces power only at the reset phase, since at the SET phase all cells at the target wordline are HRS, and the read does not reveal information. The read targets only the cells that need RESET, with their specific bitline and wordline configuration, instead of performing RESET on all row cells. The first row (W1) RESET is equivalent to a single wordline RESET-before-SET with prior read:

$$P_{W1} = P_{RD-RBS-RST}$$

At the second row RESET, there is a single row with ¾ HRS cells and (M−2) rows with random data:

$$P_{W2} = \frac{N}{4} P_{RST} + \frac{3N}{4} V_{RBL}^2 \left( \frac{1}{3R_L} + \frac{2}{3R_H} \right) +$$

-continued $$\left(\frac{1}{4R_L} + \frac{3}{4R_H}\right)\left[\frac{N}{4}(V_{RST} - V_{RWL})^2 + \frac{3N}{4}(V_{RBL} - V_{RWL})^2\right] +$$

$$(M-2)\left[\frac{N}{4}(V_{RST} - V_{RWL})^2\left(\frac{1}{2R_L} + \frac{1}{2R_H}\right) +\right.$$

$$\left.\frac{3N}{4}(V_{RBL} - V_{RWL})^2\left(\frac{1}{2R_L} + \frac{1}{2R_H}\right)\right].$$

The power consumption when doing RESET to the third wordline is:

$$P_{W3} = \frac{N}{4}P_{RST} + \frac{3N}{4}V_{RBL}^2\left(\frac{1}{3R_L} + \frac{2}{3R_H}\right) +$$

$$2\left(\frac{1}{4R_L} + \frac{3}{4R_H}\right)\left[\frac{N}{4}(V_{RST} - V_{RWL})^2 + \frac{3N}{4}(V_{RBL} - V_{RWL})^2\right] +$$

$$(M-3)\left[\frac{N}{4}(V_{RST} - V_{RWL})^2\left(\frac{1}{2R_L} + \frac{1}{2R_H}\right) +\right.$$

$$\left.\frac{3N}{4}(V_{RBL} - V_{RWL})^2\left(\frac{1}{2R_L} + \frac{1}{2R_H}\right)\right].$$

At the last ith row RESET out of M rows, (i−1) rows are with ¾ cells HRS. The consumed power is:

$$P_{Wi} = \frac{N}{4}P_{RST} + \frac{3N}{4}V_{RBL}^2\left(\frac{1}{3R_L} + \frac{2}{3R_H}\right) +$$

$$(i-1)\left(\frac{1}{4R_L} + \frac{3}{4R_H}\right)\left[\frac{N}{4}(V_{RST} - V_{RWL})^2 + \frac{3N}{4}(V_{RBL} - V_{RWL})^2\right] +$$

$$(M-i)\left[\frac{N}{4}(V_{RST} - V_{RWL})^2\left(\frac{1}{2R_L} + \frac{1}{2R_H}\right) +\right.$$

$$\left.\frac{3N}{4}(V_{RBL} - V_{RWL})^2\left(\frac{1}{2R_L} + \frac{1}{2R_H}\right)\right].$$

The sum of RESET power of i rows out of M, given prior mad data is:

$$P_{RD-SUB-RST} = \sum_{j=1}^{I} P_{Wj} = i\left[\frac{N}{4}P_{RST} + \frac{3N}{4}V_{RBL}^2\left(\frac{1}{3R_L}\right) + \left(\frac{2}{3R_H}\right)\right] +$$

$$\sum_{j=0}^{i-1}\left(\frac{1}{4R_L} + \frac{3}{4R_H}\right)\left[+\frac{N}{4}(V_{RST} - V_{RWL})^2 + \frac{3N}{4}(V_{RBL} - V_{RWL})^2\right] +$$

$$\sum_{j=M-i}^{M-1}\left[\frac{N}{4}(V_{RST} - V_{RWL})^2\left(\frac{1}{2R_L} + \frac{1}{2R_H}\right)\frac{3N}{4}(V_{RBL} - V_{RWL})^2\right.$$

$$\left.\left(\frac{1}{2R_L} + \frac{1}{2R_H}\right)\right] = i\left[\frac{N}{4}P_{RST} + \frac{3N}{4}V_{RBL}^2\left(\frac{1}{3R_L} + \frac{2}{3R_H}\right)\right] +$$

$$\frac{i(i-1)}{2}\left(\frac{1}{4R_L} + \frac{3}{4R_H}\right)\left[\frac{N}{4}(V_{RST} - V_{RWL})^2 + \frac{3N}{4}(V_{RBL} - V_{RWL})^2\right] +$$

$$\frac{i(2M-i-1)}{2}\left[\frac{N}{4}(V_{RST} - V_{RWL})^2\left(\frac{1}{2R_L} + \frac{1}{2R_H}\right) +\right.$$

$$\left.\frac{3N}{4}(V_{RBL} - V_{RWL})^2\left(\frac{1}{2R_L} + \frac{1}{2R_H}\right)\right].$$

In the SET phase, data read is not performed. The first wordline is written when all cells are in HRS in i rows and THE other (M−i) rows are with random data. In each wordline SET, the number of HRS rows decreases and random data rows increases by one. Therefore, it is equivalent to sub-block SET without prior read.

$$P_{RD-SUB-SET} = P_{SUB-SET}.$$

The overall write power of sub-block with prior read in RESET phase is:

$$P_{RD-SU-R\&S} = i \cdot P_{RD} + P_{RD-SUB-RST} + P_{RD-SUB-SET}$$

The result, normalized per single wordline, is:

$$P_{RD-SUB-R\&S} = P_{RD}\frac{N}{4}P_{RST} + \frac{3N}{4}V_{RBL}^2\left(\left(\frac{1}{3R_L}\right) + \left(\frac{2}{3R_H}\right)\right) +$$

$$\frac{N}{4}\frac{(i-1)}{2}\left(\frac{1}{4R_L} + \frac{3}{4R_H}\right)[(V_{RST} - V_{RWL})^2 + 3(V_{RBL} - V_{RWL})^2] +$$

$$\frac{2(M-i-1)}{2}\frac{N}{4}\left(\frac{1}{2R_L} + \frac{1}{2R_H}\right)[(V_{RST} - V_{RWL})^2 + 3(V_{RBL} - V_{RWL})^2] +$$

$$\frac{N}{4}\left(P_{SET} + \frac{V_{SET}^2}{R_L}\right) + \frac{N}{2}(V_{SET} - V_{SBL})^2\frac{1}{R_H} +$$

$$\frac{N}{2}\frac{(i-1)}{2}\left(\frac{1}{4R_L} + \frac{3}{4R_H}\right)[V_{SWL}^2 + (V_{SWL} - V_{SBL})^2] +$$

$$\frac{(2M-i-1)}{2}\frac{N}{4}\left(\frac{1}{2R_L} + \frac{1}{2R_H}\right)[V_{SWL}^2 + (V_{SWL} - V_{SBL})^2]$$

3) Consolidated Copy-Back and Write

Given a block with i out of M invalid wordlines, a first step according to an embodiment is read out the valid pages:

$$P_{Prior-RD} = (M-i)P_{RD}$$

Next, an energy-efficient bitline-wise erase is performed column-by-column to all cells in the block:

$$P_{Block-ERS} = \sum_{N}\left(\frac{M}{2}P_{RST} + \frac{M}{2}\frac{V_{RST}^2}{R_H}\right) = \frac{MN}{2}\left(P_{RST} + \frac{V_{RST}^2}{R_H}\right)$$

According to an embodiment, after an erase, the read valid pages are grouped with additional new data for a total of M new write requests. The aggregated write is performed row-by-row. The power per wordline write grows since as more pages are written, more cells at LRS have unwanted voltage drops.

The SET power of the first wordline W1 is:

$$P_{W1} = \frac{N}{2}P_{SET} + \frac{N}{2}\frac{(V_{SET} - V_{SBL})^2}{R_H} + (M-1)\frac{N}{2}\left[\frac{V_{SWL}^2}{R_H} + \frac{(V_{SWL} - V_{SBL})^2}{R_H}\right]$$

In the SET of the second wordline W2, the consumed power is:

$$P_{W2} =$$

$$\frac{N}{2}P_{SET} + \frac{N}{2}\frac{(V_{SET} - V_{SBL})^2}{R_H} + (M-2)\frac{N}{2}\left[\frac{V_{SWL}^2}{R_H} + \frac{(V_{SWL} - V_{SBL})^2}{R_H}\right] +$$

$$\frac{N}{2}[V_{SWL}^2 + (V_{SWL} - V_{SBL})^2]\left(\frac{1}{2R_L} + \frac{1}{2R_H}\right)$$

The power at the third wordline W3 is:

$$P_{W3} = \frac{N}{2}P_{SET} + \frac{N}{2}\frac{(V_{SET}-V_{SBL})^2}{R_H} + (M-3)\frac{N}{2}\left[\frac{V_{SWL}^2}{R_H} + \frac{(V_{SWL}-V_{SBL})^2}{R_H}\right] + 2\frac{N}{2}[V_{SWL}^2+(V_{SWL}-V_{SBL})^2]\left(\frac{1}{2R_L}+\frac{1}{2R_H}\right)$$

At the last wordline (there are a total of M wordlines per block):

$$P_{WM} = \frac{N}{2}P_{SET} + \frac{N}{2}\frac{(V_{SET}-V_{SBL})^2}{R_H} + (M-1)\cdot\frac{N}{2}[V_{SWL}^2+(V_{SWL}-V_{SBL})^2] + \left(\frac{1}{2R_L}+\frac{1}{2R_H}\right)$$

The power expressions for a SET process for wordline's index i out of M, when previous (i−1) wordlines have already been written:

$$P_{Wi} = \frac{N}{2}P_{SET} + \frac{N}{2}\frac{(V_{SET}-V_{SBL})^2}{R_H} + (M-i)\frac{N}{2}\left[\frac{V_{SWL}^2}{R_H} + \frac{(V_{SWL}-V_{SBL})^2}{R_H}\right] + (i-1)\frac{N}{2}[V_{SWL}^2+(V_{SWL}-V_{SBL})^2] + \left(\frac{1}{2R_L}+\frac{1}{2R_H}\right)$$

Summing the accumulated power of row-by-row SET after the block had been erased is:

$$P_{ERS-SET} = \sum_{i=1}^{M} P_{Wi} = \frac{MN}{2}\left[P_{SET} + \frac{(V_{SET}-V_{SBL})^2}{R_H}\right] + \frac{N}{2}\left[\frac{V_{SWL}^2}{R_H} + \frac{(V_{SWL}-V_{SBL})^2}{R_H}\right]$$
$$\sum_{i=0}^{M}(M-i) + \frac{N}{2}[V_{SWL}^2+(V_{SWL}-V_{SBL})^2]\left(\frac{1}{2R_L}+\frac{1}{2R_H}\right)\sum_{i=1}^{M}(l-1) =$$
$$\frac{MN}{2}\left[P_{SET} + \frac{(V_{SET}-V_{SBL})^2}{R_H}\right] +$$
$$\frac{M(M-1)}{2}\frac{N}{2}\left[\frac{V_{SWL}^2}{R_H} + \frac{(V_{SWL}-V_{SBL})^2}{R_H}\right] +$$
$$\frac{M(M-1)}{2}\frac{N}{2}[V_{SWL}^2+(V_{SWL}-V_{SBL})^2]\left(\frac{1}{2R_L}+\frac{1}{2R_H}\right) =$$
$$\frac{MN}{2}\left[P_{SET} + \frac{(V_{SET}-V_{SBL})^2}{R_H}\right] +$$
$$\frac{M(M-1)}{2}\frac{N}{2}[V_{SWL}^2+(V_{SWL}-V_{SBL})^2]\left(\frac{1}{2R_L}+\frac{3}{2R_H}\right)$$

The overall power of consolidated copy-back and write (CBWR), given a block with i invalid pages is:

$$P_{CBWR} = P_{Prior-RD} + P_{Block-ERS} + P_{ERS-SET}$$

The normalized power per wordline when writing for i wordlines IS:

$$P_{CBWR-WL} = \frac{1}{i}P_{CBWR}$$

Figure 2A:
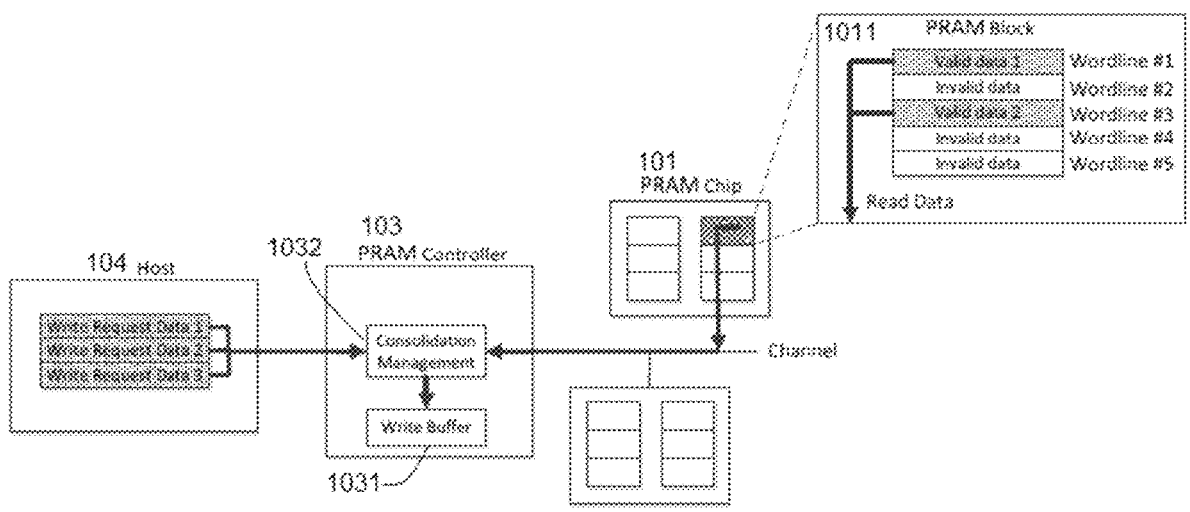
FIGS. 2A-2C illustrate a consolidation of copy-back and write operations, according to an embodiment of the disclosure.
Figure 2B:
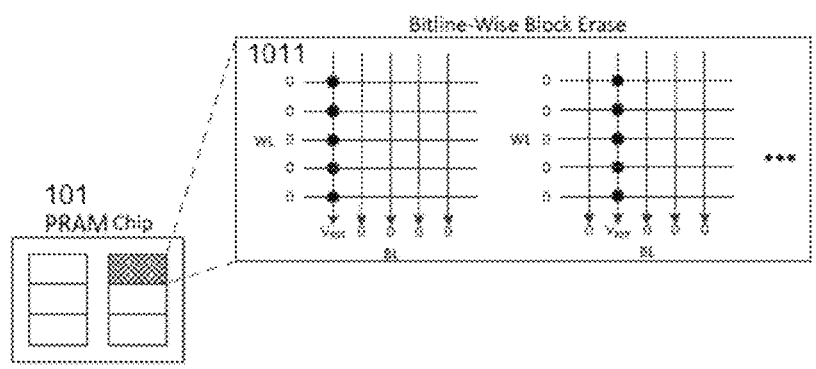
Figures 2C, 3:
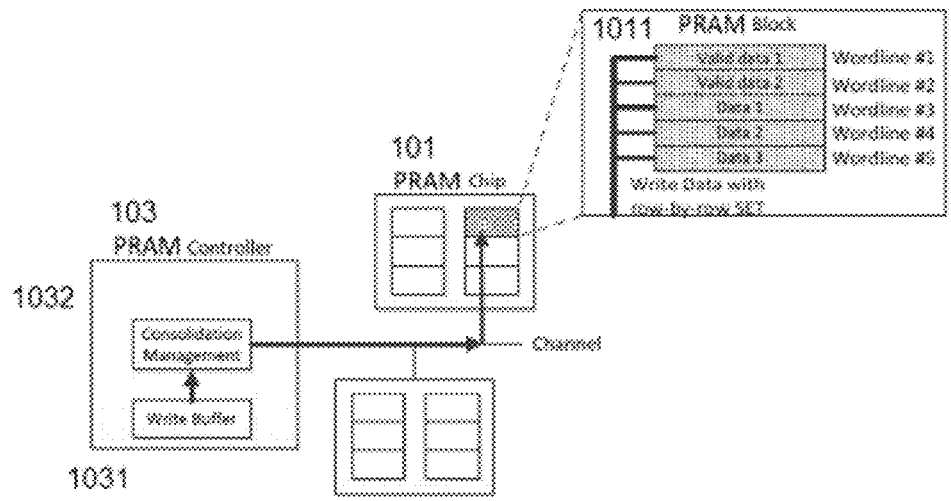
FIG. 3 is a table that summarizes results of various power dissipation models, according to embodiments of the disclosure.

A consolidation of copy-back and write operations according to an embodiment is depicted in FIGS. 2A-C. In FIG. 2A, a target PRAM block 101 with 3 invalid data pages is selected for consolidation. Valid data pages 1 and 2 are read out and are placed in wordlines 1 and 3. Incoming write requests 1, 2, 3 are received by the PRAM controller 103 from host 104 and new/incoming data are placed by the consolidation management 1032 in the write buffer 1031 of the PRAM controller 103. In FIG. 28, a bitline-wise block erase is performed on the target block 1011, by sequentially powering on each bitline with $V_{RST}$ where all other bitlines/wordlines are grounded. In FIG. 2C, valid data pages 1, 2 and incoming data 1, 2, 3 are copied-back to the target block 1011 by a row-by-row SET, such that the erased block is written with incoming data 1, 2, 3 and previous data pages 1, 2. A summary of results of the power dissipation models according to embodiments, with consolidated copy-back and write, sub block SET&RESET with prior read, and single-wordline write with prior read is shown in Table 1, FIG. 3.

Threshold-Based Consolidation Algorithm

According to an embodiment, to determine the number of invalid pages, denoted by i, in which consolidation is more power-efficient than a sub-block write, the expressions are compared and the resulting equation is solved:

$$P_{CBWR-WL}(i) = P_{RD-SUB-R\&S}(i)$$

Since these equations are quadratic, there are two possible solutions, and the smaller one is taken into account since the other is out of range. The solution is illustrated in Table 3, FIG. 6. The threshold is used to determine whether to perform consolidation of copy-back and write or perform a sub-block write algorithm. Detailed steps are given in Algorithm 1.

Figure 4:
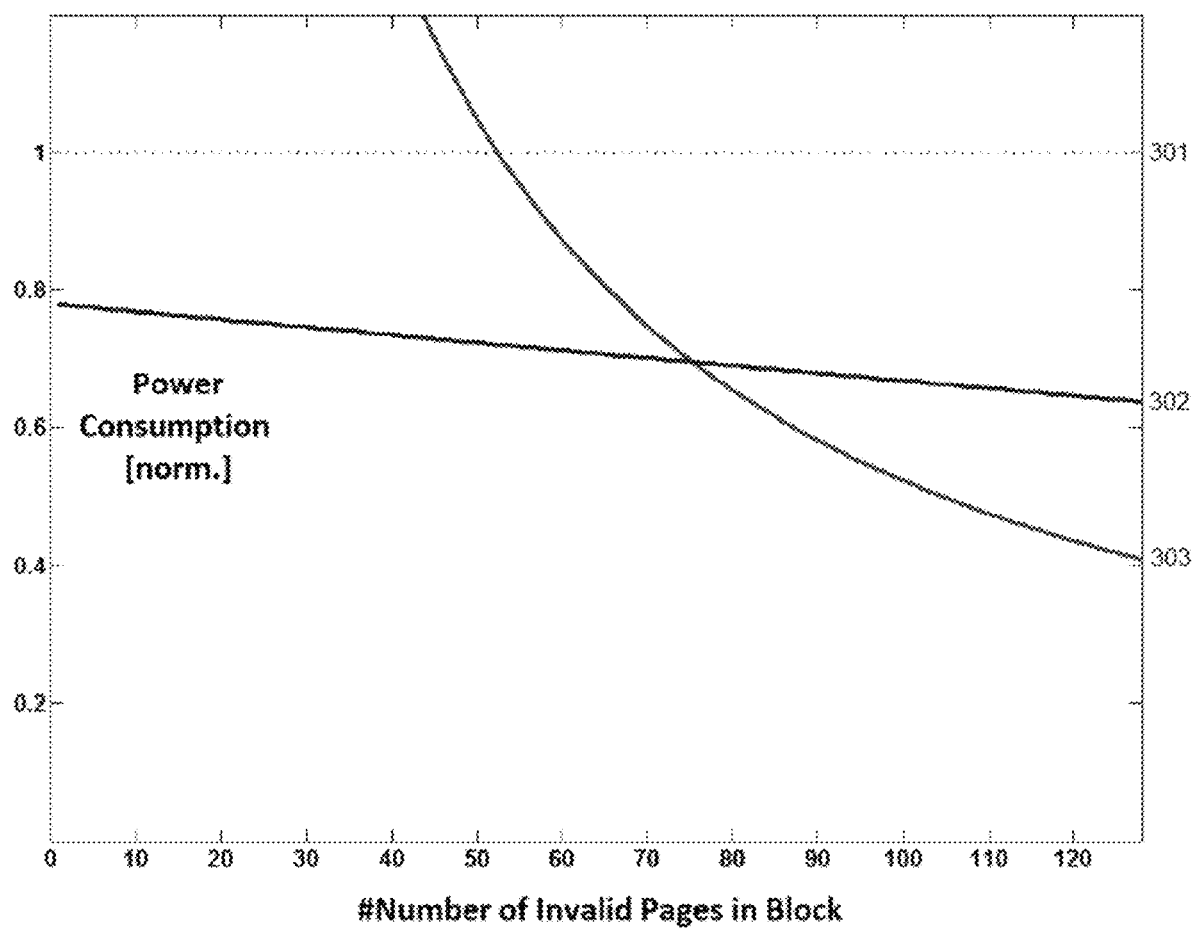
FIG. 4 is a table that illustrates the determination of a consolidation threshold, according to embodiments of the disclosure.

Algorithm 1: Consolidation of Copy-Back and Write
Input: threshold t as calculated in Table 2
(1) choose the block with most invalid pages
(2) if #number of invalid pages>t
(2.1) read valid pages
(2.2) bitline-wise block erase
(2.3) write back valid pages and incoming write requests
(3) Else
(3.1) perform sub-block write algorithm
(4) End If Energy Savings and Implementation Overhead According to an embodiment, the exact power of the expressions in Table 1 are calculated and normalized according to a random wordline write with prior read. FIG. 4 is a graph of the power consumption results as a function of the number of invalid pages in a PRAM block (i) for a single wordline RBS/SBR with read 301, a sub-block RESET/SET with READ 302, and a consolidated clock ERASE/SET with copy-back and write 303. The power is normalized to a single random-wordline write, and the initial block is assumed to occupy uniformly random data. The device and array parameters that are considered in the power estimation are shown in Table 2, FIG. 5. In addition, evaluation software that calculates the graph with proper crossing points with different device variables and block sizes is attached in the appendix.

According to an embodiment, up to a 40% power reduction is observed as compared to only a sub-block write algorithm and up to 60% as compared to a current random wordline write. The gain increases exponentially above a threshold. The exact gain is determined according to workload characteristics and the distribution of invalid pages in blocks.

According to an embodiment, implementation of a consolidated copy-back with write involved modifying the controller as follows.

Write Data Buffer:

The controller should be able to accumulate incoming write requests data and valid pages data of target block. However, this buffer is also used by sub-block write algorithms and therefore smaller changes are made over previous algorithm overhead.

Controller Logic and Software:

According to an embodiment, the consolidation process should be managed by the controller and includes meta-data management of invalid pages in a block, which already exists in current write mechanisms, a scheduler for reading valid pages, write buffer management and allocating copy-back and write incoming pages to the target block. Additional overhead over a sub-block write is the threshold consideration.

According to an embodiment, PRAM array voltages for bitline-wise erases are a sub-group of regular RESET processes, and can be implemented in a conventional memory chip.

Expansion of a consolidation process according to an embodiment to multi-level cells does not require additional modifications. Furthermore, a consolidation process according to an embodiment can be combined with other write algorithms to increase data reliability, since the reduction of power drops over unselected cells also reduces write disturb. A consolidation process according to an embodiment is scalable as it achieves more gain, i.e. lower power, as a block size grows. The overhead can be shown to be practical, and can be reduced further if an algorithm according to an embodiment id implemented on top of a previous sub-block write scheme.

Wear Leveling and Bad Row Management During a wear leveling process according to an embodiment, line data is copied and re-written to another line. The re-write process to the new line can detect a bad row and activate a bad-row management within a wear leveling process.

Wear Leveling

A wear-leveling (WL) algorithm according to an embodiment of the disclosure works by constantly changing the logical-to virtual (L2V) address mapping, and re-mapping the memory lines according to the new mapping The act of changing the entire mapping one time can be referred to as a "round", and the act of re-mapping one memory-line according to the new mapping can be referred to as a "step". When all memory-lines are re-mapped according to the new mapping, i.e., one per step, one round is complete, the mapping changes, and a new round begins.

Figure 7:
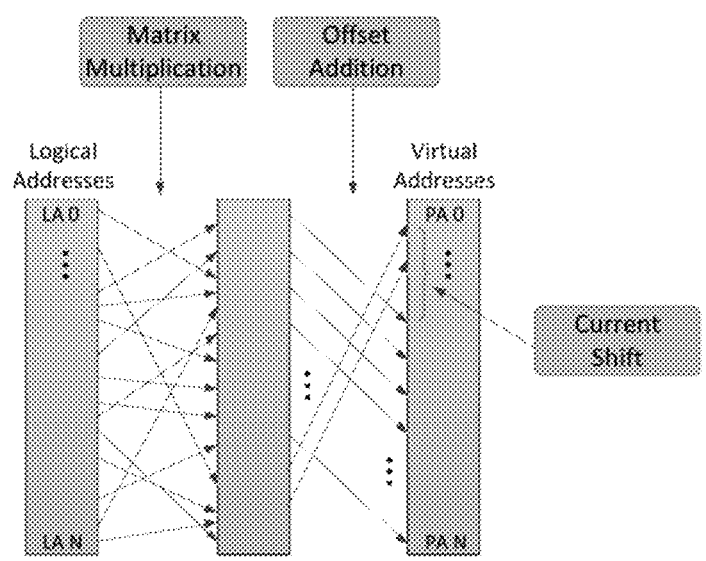
FIG. 7 illustrates that a logical-to virtual (L2V) address mapping includes a fixed component and a changing component, according to an embodiment of the disclosure.

A mapping function according to an embodiment includes two components: a first, fixed component, and a second, which is composed on the first, changing component. As illustrated in FIG. 7, the fixed part is a multiplication of the logical address (LA), viewed as a binary vector, by a fixed binary invertible matrix, and the changing part is an addition, modulo the number of lines, of a fixed offset to the result of the previous step, viewed this time as a natural number represented in binary. In each round, this offset is increased by one modulo the number of physical lines. The result is a binary vector of virtual addresses (VA).

According to an embodiment, a bad row management (BRM) algorithm acts on top of a WL-algorithm. A BRM algorithm "filters out" the bad blocks, by mapping the virtual addresses to physical addresses that are not bad.

Figure 8:
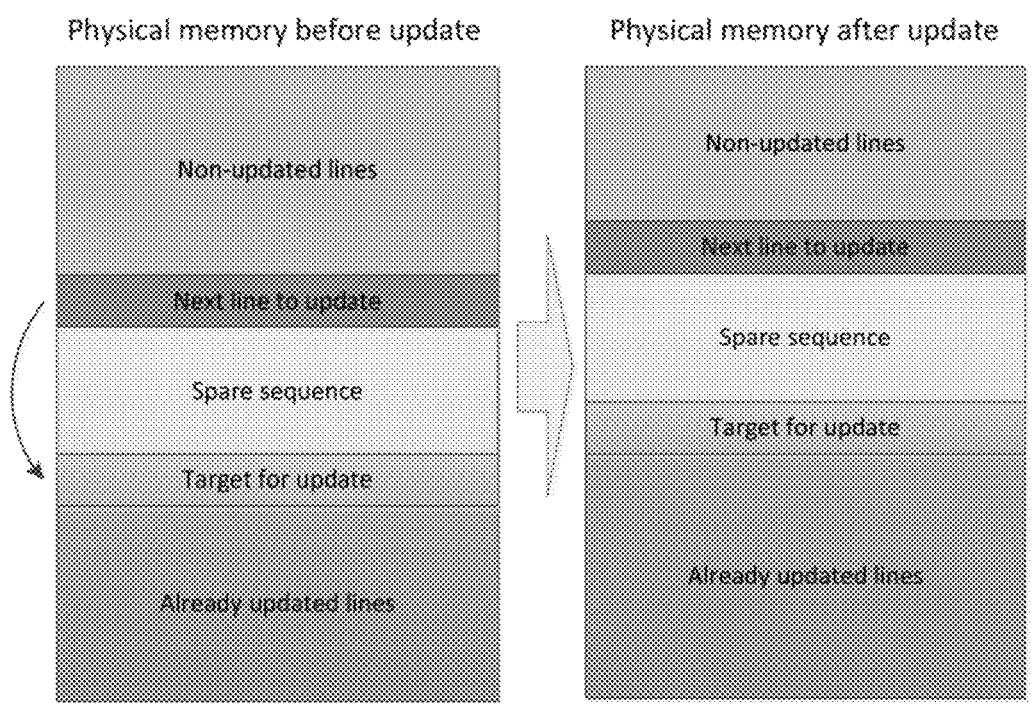
FIG. 8 illustrates how wear-leveling uses the last line from the sequence as the target for the newly transferred line, so that within each round the lines are updated in a descending order, according to an embodiment of the disclosure.

To enable a WL-algorithm according to an embodiment, a spare physical line is used, so there is always a free line into which to move the currently-updated line; when this currently-updated line is transferred, its previous location is the target for the next re-mapped line, and so on. However, according to an embodiment, a WL-algorithm and a BRM-algorithm work in combination: since the BRM requires over-provisioning, at any given time there is a sequence of spare lines; in each step the WL algorithm uses the last line from this sequence as the target for the newly transferred line; its previous location enters the sequence; and so on. Thus, the spare sequence moves along the physical space, and within each round the lines are updated in a descending order, as illustrated in FIG. 8.

During the life of a PRAM, the size of the spare sequence is decreased, as new lines are declared "bad". The failure mechanism is that due to temperature changes, the physical contact between chip circuitry and line contact becomes disconnected, so that the line itself becomes inoperative.

According to an embodiment, a step is performed according to a system timing policy. Some possible policies are:

Execute one step every predetermined (parameterized) number of write operations.

Execute multiple steps when the system is idle.

A hybrid of the previous two: maintain a balance between the number of write operations and the executed steps by using idle periods to execute steps when such periods exist, but when there are no idle periods and the system deviates somewhat from balance, initiate step executions until the balance is reached again.

According to an embodiment, an L2V mapping can be defined as follows:

At round r, executing step s comprises mapping address $\vec{x} \in \{0,1\}^n$:

$$f(\vec{x}) = \vec{x} \cdot P \cdot \vec{b} + r + c \cdot (\mod 2^n + z),$$

where:

n is the log (base 2) of the logical address space size;

P is the permutation (invertible) n×n matrix;

$\vec{b} = (2^{n-1}, 2^{n-2}, \ldots, 1)^T$, used here to convert the binary vector to the natural number it represents;

z is the current number of spare lines; and $$c = \begin{cases} 1, & \vec{x} \cdot P \cdot \vec{b} \geq n - s \\ 0, & \text{else} \end{cases},$$

that is, c equals 0 if physical address $\vec{x} \cdot P \cdot \vec{b}$ is not updated in the current round, and 1 otherwise.

Note that the multiplication by $\vec{b}$ is written here for formal reasons, it does not correspond to any operation in hardware. In hardware, the result of $\vec{x} \cdot P$ is simply added to $r + c \cdot z$.

Bad Row Management

According to an embodiment, the output of the L2V module is provided as input to a BRM algorithm, which filters out lines that are declared as bad by mapping the virtual addresses to the set of lines that are not declared bad. This means, in particular, that the size of the virtual space is exactly the number of non-bad lines.

Lines can be declared as bad either at manufacture time, or during the life of the PRAM, however, embodiments of the disclosure can handle both cases similarly.

A virtual-to-physical (V2P) address mapping is straightforward: virtual address v is mapped to the v-th non-bad line. The implementation is as follows: Let the sorted list of physical addresses of bad lines be $(b_1, \ldots, b_l)$, where l is the current number of bad lines.

A BRM algorithm according to an embodiment maintains a list $S=(s_1, \ldots, s_l)$ derived from the set of bad lines as follows: the value of $s_i$ is the largest virtual address mapped to a physical address below $b_i$. Formally: $s_i=b_i-i$. In addition, define $s_0=-1$ for convenience.

Then, the virtual address v is mapped to v+i where i is the index of a maximum value s such that $s_i<v$. The value i can be found through a binary search.

Figure 9:
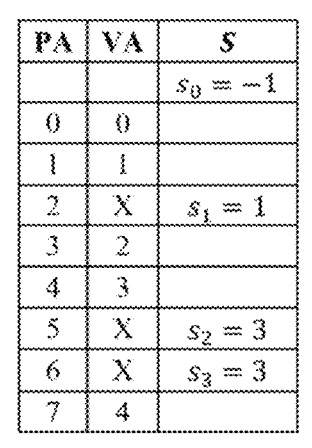

The table of FIG. 9 illustrates an example of a V2P mapping, where virtual addresses that are X's denote bad lines.

According to an embodiment, the list S can be maintained as follows.

Initialization:
1. $s_0 \leftarrow -1$
2. For i=1 to l
2.1. $s_i \leftarrow \infty$ Insertion:
Input: new bad physical line b
1. Find via binary search the maximal j such that $s_j+j<b$
// Insert b−(j+1) to $s_{j+1}$:
2. For i=l to j+2
2.1. $s_i \leftarrow s_{i-1}$
3. $s_{j+1} \leftarrow b-(j+1)$ According to an embodiment, since a BRM algorithm is based on binary search, the number of supported bad blocks is limited by the number of steps that the binary search can support. To support a larger number of bad lines, an alternative approach according to an embodiment would be to declare as "bad" units that are larger than lines. If these units have $2^q$ lines, then q steps are saved in the binary search. These units are managed similarly as before, but over a space of size divided by $2^q$, and declaring a unit as bad when the first line in the unit turns bad. Denoting the previous mapping by f, the mapping then is performed as following:
Input: virtual address v
Output: physical address p
Parameter: BRM granularity q
1. $q \leftarrow \lfloor v/2^r \rfloor$
2. $r \leftarrow v \leftarrow q$
3. $p \leftarrow f(q)+r$ System Implementations It is to be understood that embodiments of the present disclosure can be implemented in various forms of hardware, software, firmware, special purpose processes, or a combination thereof. In some embodiments, the present disclosure can be implemented in hardware as an application-specific integrated circuit (ASIC), or as a field programmable gate array (FPGA). In other embodiments, the present disclosure can be implemented in software as an application program tangible embodied on a computer readable program storage device. The application program can be uploaded to, and executed by, a machine comprising any suitable architecture.

Figure 10:
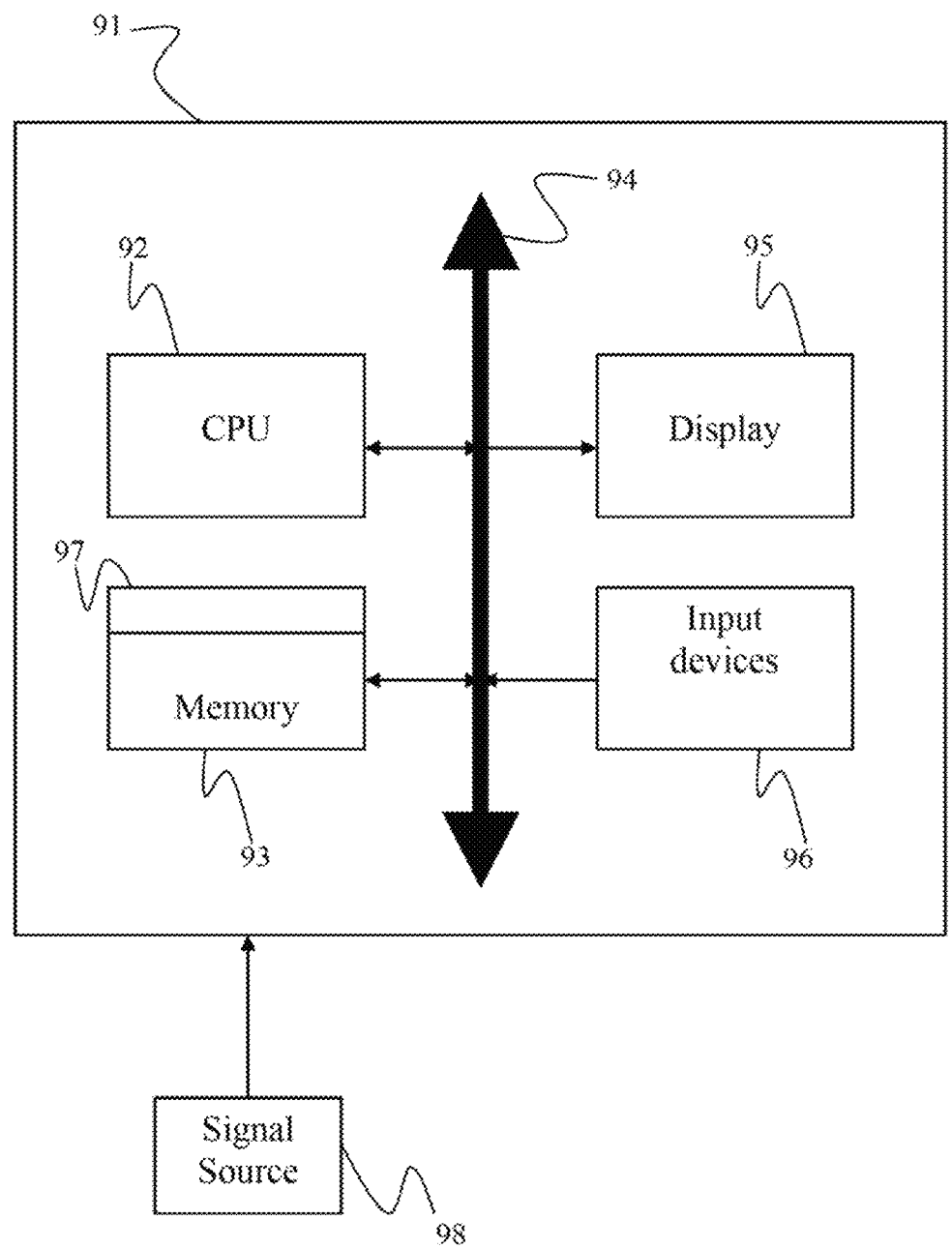
FIG. 10 is a block diagram of a system that implements a method for combining a write algorithm with selective valid pages read and copy-back, according to an embodiment of the disclosure.

FIG. 10 is a block diagram of a system that implements a method for combining a write algorithm with selective valid pages read and copy-back according to an embodiment of the disclosure that consumes low power and maintains the required precision. Referring now to FIG. 10, a computer system 91 for implementing the present invention can comprise, inter alia, a central processing unit (CPU) 92, a memory 93 and an input/output (I/O) interface 94. The computer system 91 is generally coupled through the I/O interface 94 to a display 95 and various input devices 96 such as a mouse and a keyboard. The support circuits can include circuits such as cache, power supplies, clock circuits, and a communication bus. The memory 93 can include random access memory (RAM), read only memory (ROM), disk drive, tape drive, etc., or a combinations thereof. The present disclosure can be implemented as a routine 97 that is stored in memory 93 and executed by the CPU 92 to process the signal from the signal source 98. As such, the computer system 91 is a general purpose computer system that becomes a specific purpose computer system when executing the routine 97 of the present invention. Alternatively, as described above, embodiments of the present disclosure can be implemented as an ASIC or FPGA 97 that is in signal communication with the CPU 92 to process the signal from the signal source 98.

The computer system 91 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the present invention has been described in detail with reference to exemplary embodiments, those skilled in the art will appreciate that various modifications and substitutions can be made thereto without departing from the spirit and scope of the invention as set forth in the appended claims.

What is claimed is:

1. A method of performing a write operation in a random access memory (RAM), comprising the steps of:
   selecting a target block in the RAM with a greatest number of invalid pages;
   reading valid pages from target block, when a number of invalid pages is greater than a predetermined threshold;
   performing a bitline-wise block erase of the target block in said RAM; and
   copying-back valid data to the erased target block in a row-by-row set operation, wherein the erased target block is written with the valid data.

2. The method of claim 1, further comprising receiving an incoming write request, and writing data of the incoming write request to the erased target block in the row-by-row set operation, wherein the incoming data is written to the erased target block along with the valid data.

3. The method of claim 2, further comprising placing data of the incoming write request in a write buffer of a controller of said RAM.

4. The method of claim 1, wherein performing the bitline-wise block erase comprises sequentially powering on each bitline with a predetermined reset voltage wherein all other bitlines and wordlines are grounded.

5. The method of claim 1, further comprising, when the number of invalid pages is less than or equal to a predetermined threshold, performing a sub-block write operation of data received with a write request.

6. The method of claim 1, wherein the RAM is one selected from a group comprising a phase change random-access memory, a resistive random-access memory, a ferroelectric random-access memory, and a magnetoresistive random-access memory.

7. The method of claim 1, wherein the bitline-wise block erase is one of a partial block erase or a full block erase.

8. The method of claim 1, wherein the steps of selecting a target block, reading valid pages from target block, performing a bitline-wise block erase of the target block, and copying-back valid data to the erased target block are performed as one of an automatic refresh operation or as an operation initiated by a user.

9. The method of claim 1, further comprising mapping a logical address of a bitline of the target block to a virtual address according to $$f(\vec{x}) = \vec{x} \cdot P \cdot \vec{b} + r + c \cdot (\bmod\ 2^n + z)$$

wherein $\vec{x}$ is an n-bit logical address, $f(\vec{x})$ is the virtual address, n is a log (base 2) of the logical address space size, P is an invertible n×n permutation matrix, $\vec{b} = (2^{n-1}, 2^{n-2}, \ldots, 1)^T$ is a vector that converts the binary n-bit address to a natural number, z is a current number of spare lines, $$c = \begin{cases} 1, & \text{if } \vec{x} \cdot P \cdot \vec{b} \geq n - s \\ 0, & \text{otherwise} \end{cases},$$

r is a round number, wherein a round is an act of remapping all lines in the target block, and s is a step number, wherein a step is an act of re-mapping one bitline.

10. The method of claim 9, further comprising mapping the virtual address of the bitline of the target block to a physical address by mapping the virtual address v to v+i where i is the index of a maximum value s such that $s_i < v$, wherein $s_i \in S = (s_1, \ldots, s_i)$ wherein a value of $s_i$ is a largest virtual address that maps to a physical address below $b_i$ wherein $b_i \in (b_1, \ldots, b_l)$, a sorted list of physical addresses of bad lines wherein l is a current number of bad lines.

11. A non-transitory program storage device readable by a computer, tangibly embodying a program of instructions executed by the computer to perform the method steps for a write operation in a random access memory (RAM), the method comprising the steps of:
selecting a target block in the RAM with a greatest number of invalid pages;
reading valid pages from target block, when a number of invalid pages is greater than a predetermined threshold; and
performing a bitline-wise block erase of the target block in said RAM,
wherein performing the bitline-wise block erase comprises sequentially powering on each bitline with a predetermined reset voltage wherein all other bitlines and wordlines are grounded.

12. The computer readable program storage device of claim 11, the method further comprising receiving an incoming write request, and copying-back valid data to the erased target block in a row-by-row set operation, wherein data of the incoming write request is written to the erased target block in the row-by-row set operation, the incoming data is written to the erased target block along with the valid data, and the erased target block is written with the valid data.

13. The computer readable program storage device of claim 12, the method further comprising placing data of the incoming write request in a write buffer of a controller of said RAM.

14. The computer readable program storage device of claim 11, the method further comprising, when the number of invalid pages is less than or equal to a predetermined threshold, performing a sub-block write operation of data received with a write request.

15. The computer readable program storage device of claim 11, wherein the RAM is one selected from a group comprising a phase change random-access memory, a resistive random-access memory, a ferroelectric random-access memory, and a magnetoresistive random-access memory.

16. The computer readable program storage device of claim 11, wherein the bitline-wise block erase is one of a partial block erase or a full block erase.

17. The computer readable program storage device of claim 11, wherein the steps of selecting a target block, reading valid pages from target block, performing a bitline-wise block erase of the target block, and copying-back valid data to the erased target block are performed as one of an automatic refresh operation or as an operation initiated by a user.

18. The computer readable program storage device of claim 11, the method further comprising mapping a logical address of a bitline of the target block to a virtual address according to $$f(\vec{x}) = \vec{x} \cdot P \cdot \vec{b} + r + c \cdot (\bmod\ 2^n + z),$$

wherein $\vec{x}$ is an n-bit logical address, $f(\hat{x})$ is the virtual address, n is a log (base 2) of the logical address space size, P is an invertible n×n permutation matrix, $\vec{b} = (2^{n-1}, 2^{n-2}, \ldots, 1)^T$ is a vector that converts the binary n-bit address to a natural number, z is a current number or spare lines, $$c = \begin{cases} 1, & \text{if } \vec{x} \cdot P \cdot \vec{b} \geq n - s \\ 0, & \text{otherwise} \end{cases},$$

r is a round number, wherein a round is an act of remapping all lines in the target block, and s is a step number, wherein a step is an act of re-mapping one bitline.

19. The computer readable program storage device of claim 18, the method further comprising mapping the virtual address of the bitline of the target block to a physical address by mapping the virtual address v to v+i where i is the index of a maximum value s such that $s_i < v$, wherein $s_i \in S = (s_1, \ldots, s_i)$ wherein a value of $s_i$ is a largest virtual address that maps to a physical address below $b_i$ wherein $b_i \in (b_2, \ldots, b_j)$, a sorted list of physical addresses of bad lines wherein i is a current number of bad lines.

* * * * *